(12) United States Patent
Hickernell

(10) Patent No.: US 6,201,457 B1
(45) Date of Patent: Mar. 13, 2001

(54) NOTCH FILTER INCORPORATING SAW DEVICES AND A DELAY LINE

(75) Inventor: Thomas S. Hickernell, Mesa, AZ (US)

(73) Assignee: CTS Corporation, ELkhart, IN (US)

( * ) Notice: Subject to any disclaimer, the term of this patent is extended or adjusted under 35 U.S.C. 154(b) by 0 days.

(21) Appl. No.: 09/193,896

(22) Filed: Nov. 18, 1998

(51) Int. Cl.[7] .................................................... H03H 9/64
(52) U.S. Cl. ........................................ 333/193; 333/195
(58) Field of Search .................................... 333/193–196

(56) References Cited

U.S. PATENT DOCUMENTS

| | | | |
|---|---|---|---|
| 4,126,837 | * 11/1978 | Koyamada et al. | 333/196 X |
| 4,577,168 | * 3/1986 | Hartmann | 333/193 X |
| 4,694,266 | * 9/1987 | Wright | 333/193 X |
| 5,473,295 | * 12/1995 | Turunen | 333/193 X |
| 5,521,453 | * 5/1996 | Yatsuda | 333/193 X |
| 5,561,406 | * 10/1996 | Ikata et al. | 333/193 X |
| 5,905,418 | * 5/1999 | Ehara et al. | 333/133 X |
| 5,933,062 | * 8/1999 | Kommrusch | 333/193 |

FOREIGN PATENT DOCUMENTS

| | | | |
|---|---|---|---|
| 56-47116 | * 4/1981 | (JP) | 333/193 |
| 6-61783 | * 3/1994 | (JP) | 333/193 |
| 6-260876 | * 9/1994 | (JP) | 333/193 |
| 7-231241 | * 8/1995 | (JP) . | |
| 8-65097 | * 3/1996 | (JP) . | |

* cited by examiner

*Primary Examiner*—Robert Pascal
*Assistant Examiner*—Barbara Summons
(74) *Attorney, Agent, or Firm*—Brian Mancini

(57) ABSTRACT

A notch filter (100) includes a parallel coupled delay line (104) and surface acoustic wave resonator (102) which provides a pole at a desired passband. The surface acoustic wave resonator (102) and the delay line (104) are configured to provide a zero at an undesired frequency or stopband. In this way, the notch filter (100) augments the stopband rejection of an associated cascaded surface acoustic wave ladder filter (105). The notch filter (100) also provides a pole at a desired frequency or passband such that losses due to the notch filter (100) at the desired passband are minimized, thereby improving overall insertion loss performance.

12 Claims, 6 Drawing Sheets

— PRIOR ART —

NOTCH FILTER INCORPORATING SAW DEVICES AND A DELAY LINE

FIELD OF THE INVENTION

This invention relates in general to the field of radio frequency apparatus, in particular to radio frequency filters and more particularly to radio frequency filters employing surface acoustic wave devices.

BACKGROUND OF THE INVENTION

There is an ongoing need for component miniaturization in radio communication devices. For example, smaller and more efficient components are needed for light-weight, hand-portable cellular telephones, wireless local area networks for linking computer systems within office buildings in a readily reconfigurable fashion, pager devices and other devices for promoting rapid, efficient and flexible voice and data communication.

Filters are needed for a variety of such communications applications wherein small size, light weight and high performance are simultaneously required. Increasing numbers of products seek to employ fixed spectral resources, often to achieve tasks not previously envisioned. Examples include cellular telephones, computer and ancillary equipment linkages as well as a host of other, increasingly complex personal or equipment information sharing requirements. The desire to render increasingly complicated communications nodes portable, places extreme demands on filtering technology in the context of increasingly crowded radio frequency resources.

Surface acoustic wave (SAW) ladder filters are a popular choice for radios because of their low loss and small size advantages. Filter performance, however, is limited by SAW resonator quality factor, Q, and capacitance ratio, r. For example, given a constant ratio of Q/r, the tradeoff between insertion loss, bandwidth, and out-of-band rejection is defined. If the rejection is increased the insertion loss must increase and the bandwidth must decrease. If, however, the rejection requirements for the SAW filter are relaxed, better passband characteristics can be achieved.

It is very common for radio designers to require several rejection specifications (shown as 10,12,14 in FIG. 1) and an insertion loss bandwidth specification (shown as 16 in FIG. 1). Typically, one small band of frequencies far from the passband must be highly attenuated in the filter (shown as 14 in FIG. 1). For a SAW ladder structure to achieve such high rejection, the filter must be designed to reject all out-of-band frequencies at that high attenuation level. This restriction limits the insertion loss and bandwidth that can be achieved in the passband as discussed above. An improvement can be obtained by cascading a notch filter with the SAW ladder filter. In this way, the ladder filter rejection requirements can be relaxed.

FIG. 2 shows a prior art notch filter 22. A SAW ladder filter, as is known in the art, is typically coupled with the notch filter 22 which consists of a parallel connected capacitor 24 and a delay line 26. Previously, such a notch filter 22 has been realized entirely in a ceramic substrate. However, the ceramic notch filter configuration only provides a zero near the high attenuation band, but no poles in the passband. As a result, the prior art notch filter 22 degrades insertion loss performance in the operating passband of the radio.

What is needed is a notch filter configuration that, while providing a stopband at a particular frequency, does not degrade the passband response of an associated SAW ladder filter at a desired frequency. It is also desirable to provide a notch filter that can be implemented with fewer components and in a compact form.

BRIEF DESCRIPTION OF THE DRAWINGS

The invention is pointed out with particularity in the appended claims. However, a more complete understanding of the present invention may be derived by referring to the detailed description and claims when considered in connection with the figures, wherein like reference characters refer to similar items throughout the figures, and:

Figure 1:
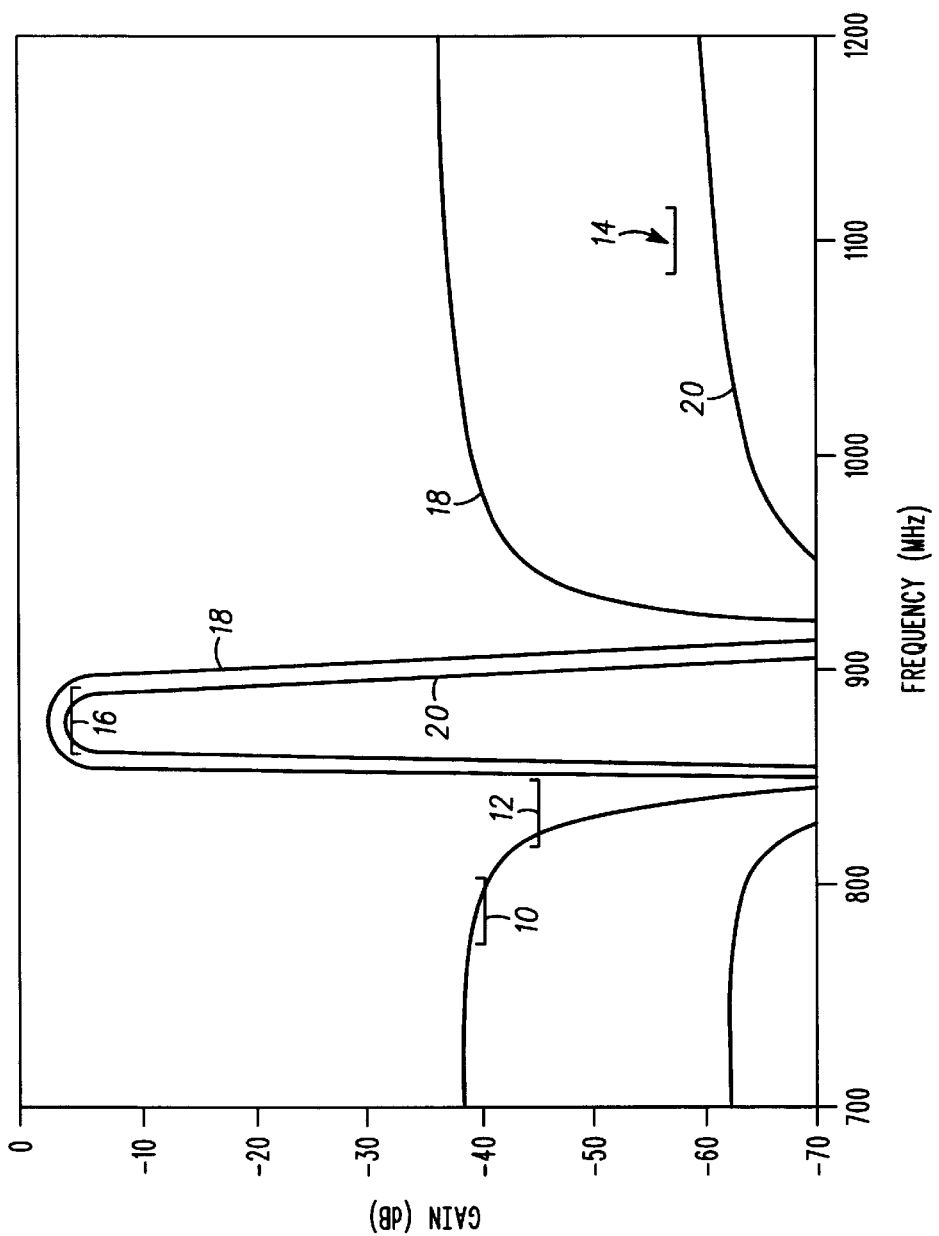
FIG. 1 shows a graph of calculated frequency responses for two ladder filters configured to meet particular specifications.

The exemplification set out herein illustrates a preferred embodiment of the invention in one form thereof, and such exemplification is not intended to be construed as limiting in any manner.

DETAILED DESCRIPTION OF THE PREFERRED EMBODIMENT

The present invention provides a notch filter configuration that provides a zero at an undesired frequency and a pole at a desired frequency. In this way, a stopband is provided at an undesired frequency without degrading the passband response of an associated SAW ladder filter at a desired frequency. In particular, the present invention actually improves insertion loss while providing higher-order filter characteristics (e.g. improved return loss). Advantageously, the present invention can be implemented with fewer components than prior art filters while in a compact form.

Surface acoustic wave resonators are known in the art. In addition, surface acoustic wave ladder filters are also known in the art and only consist of individual surface acoustic wave resonators coupled in alternating series and shunt connections. Each surface acoustic wave resonator comprises a transducer including interdigitated electrodes (also referred to as "fingers", "finger electrodes", etc.) disposed on a piezoelectric substrate and coupled alternately to a first terminal or a second terminal via respective bus bars. The resonator optionally includes reflectors disposed to either side of the transducer in the principal direction of acoustic wave propagation in the substrate, as is known in the art.

The interdigitated electrodes typically are periodic and define a particular acoustic wavelength at which the transducer exhibits a characteristic acoustic center frequency together with a center frequency wavelength for the acoustic energy transduced in response to electrical stimulation of an appropriate frequency applied via the two terminals. The electrodes are usefully one-fourth of this center frequency wavelength wide, i.e., measured along directions in accordance with design principles and performance objectives for the resonator. The electrodes are disposed on one-half acoustic wavelength centers.

Electrical stimulation at an appropriate frequency supplied from electrical terminals to bus bars and thence to interdigitated or interleaved electrodes results in acoustic waves being generated within the transducer. As used herein, the term "acoustic wavelength" is taken to mean an acoustic wavelength at the filter center frequency, i.e., in the nominal center of the filter passband.

The resonator is typically fabricated on a polished surface of a piezoelectric substrate by depositing and patterning a thin metal film, often comprising aluminum, in a thickness ranging from about 50 nm 500 Å) to about 600 nm (6000 Å), by techniques similar to those employed in integrated circuit manufacturing, and directions are carefully aligned with a preferred crystallographic axis providing the desired acoustic transduction, propagation and reflection characteristics as is known in the art.

As is known in the art, a SAW resonator can be conveniently modeled as a series RLC circuit (e.g., a resistance $R_r$ in series with an inductance L, in series with a motional capacitance $C_m$, all bridged by a larger static capacitance $C_o$ connected in parallel across the RLC circuit. Resistance $R_r$ is related to the resonant Q of the resonator. Motional capacitance $C_m$ is related to static capacitance $C_o$ by:

$$C_m = \frac{8k^2 C_o}{2} \quad (1)$$

where $k^2$ represents the electromechanical coupling coefficient (tabulated in a variety of textbooks related to piezoelectric materials). The resonant frequency $\omega_r$, is usually close to and slightly lower than the acoustic center frequency (approximately the sound velocity divided by the acoustic wavelength associated with the periodicity of electrodes of the transducer):

$$\omega_r = \frac{1}{\sqrt{LC_m}} \quad (2)$$

and antiresonant frequency, ($\omega_a$:

$$\omega_a = \omega_r \sqrt{1 \times C_m/C_o} \quad (3)$$

For a given transducer, antiresonant frequency $\omega_a$ is always greater than resonant frequency $\omega_r$ by a ratio determined by electromechanical coupling coefficient $k^2$. The capacitance ratio, $C_o/C_m$, is inversely proportional to coupling coefficient $k^2$ (Eq. 1).

In traditional acoustic filters employing ST-cut quartz resonant elements, electromechanical coupling coefficient $k^2$ is typically much smaller than 0.5%, limiting the fractional bandwidth (bandwidth divided by center frequency) achievable for such filters to very small values. In the present invention, it is preferable to use higher coupling coefficient materials (e.g., $LiNbO_3$, $LiTaO_3$, lithium tetraborate, etc.) which provide a greater spread between resonant and antiresonant frequencies, as is known in the art. For example, 64° $LiNbO_3$ provides a coupling coefficient of about 10.5%, 41° $LiNbO_3$ provides a coupling coefficient of about 17%, and 36° and 42° $LiTaO_3$ provide a coupling coefficients of about 7.5%. This increased frequency spread in turn allows further design freedom.

Filter performance is limited by SAW resonator quality factor, Q, and capacitance ratio, r. For a given substrate material the ratio of Q/r is substantially fixed. Given a constant ratio of Q/r, the tradeoff between insertion loss, bandwidth, and out-of-band rejection is defined. If the rejection is increased the insertion loss must increase and the bandwidth must decrease. If, however, the rejection requirements for the SAW filter are relaxed, better passband characteristics can be achieved.

FIG. 1 shows the calculated transmission responses of two SAW ladder filters designed for the cellular phone specifications, shown as 10,12,14,16 (chosen for demonstration purposes only). Because the resonator Q and capacitance ratio for a chosen SAW substrate material is fixed, a given SAW ladder configuration cannot meet both the tightest rejection specification 14 and the insertion loss and bandwidth specification 16 simultaneously. The first trace 18 was configured to meet the insertion loss and bandwidth specification 16, while the second trace 20 was configured to meet the rejection requirements 10,12,14. As can be seen, the first trace 18 can not meet the rejection requirements 10,12,14 and the second trace 20 can not meet the insertion loss and bandwidth requirements 16. In addition, although the highest rejection 14 is needed only for the frequency band between 1088 and 1133 MHz, the filter must be designed to reject all out-of-band frequencies at this level in order to achieve the rejection requirements. Therefore, additional filtering, in the form of a notch filter is required.

Figure 2:
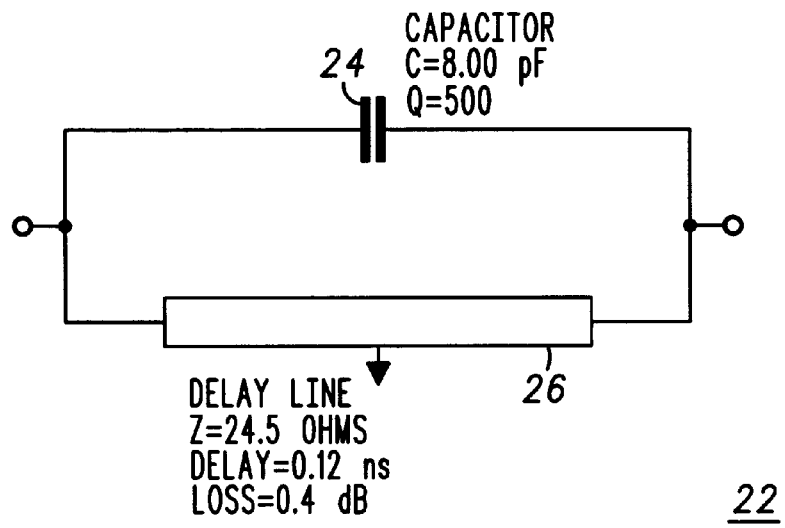
FIG. 2 is a simplified schematic diagram of a prior art notch filter.

FIG. 2 shows a prior art notch filter 22 that is configured to notch-out the 1088–1113 MHz band (shown as 14 in FIG. 1). This filter 22 provides a zero near these frequencies to augment the rejection performance of an associated ladder filter. Unfortunately, this prior art notch filter 22 also degrades the insertion loss of the ladder filter in the passband. This is not desired.

Figure 3:
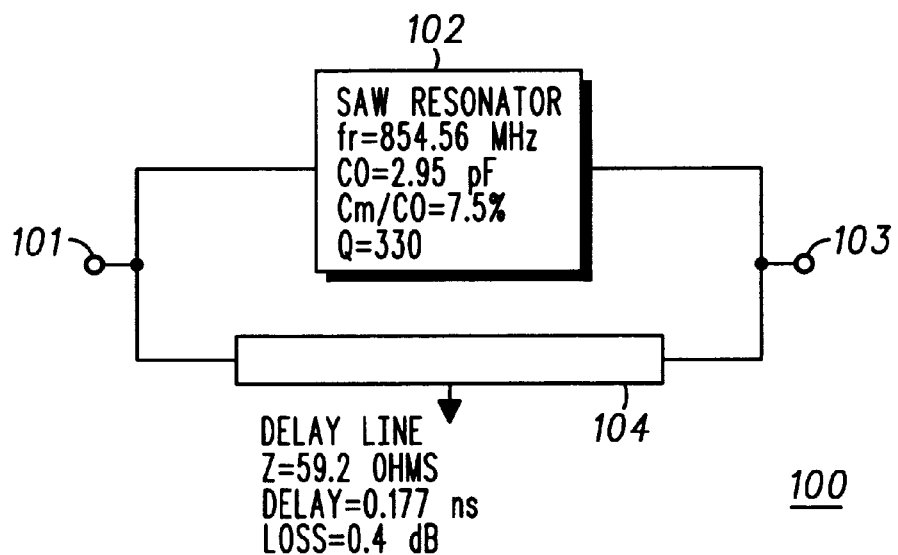
FIG. 3 is a simplified schematic diagram of a notch filter, in accordance with the present invention.

FIG. 3 shows a novel notch filter 100 concept that combines a SAW resonator 102 with a delay line 104, in accordance with the present invention. The notch filter 100 includes a first port 101 and a second port 103 and has a first attenuation at a first undesired frequency. Specifically, the notch filter 100 includes a delay line 104 coupled in series between the first and second ports 101,103 and a surface acoustic wave resonator 102 coupled in series between the first and second ports 101,103 and in parallel with the delay line 104. The surface acoustic wave resonator 102 and the delay line 104 are configured to provide a zero at the first undesired frequency and a pole at a desired frequency such that insertion loss contributed by the notch filter 100 at the desired frequency is minimized.

This new notch filter configuration provides a transmission pole at the SAW resonator's resonant frequency. This pole can be designed near an associated ladder filter's passband so that any insertion loss due to the notch filter 100 is minimized to improve overall insertion loss performance. Above the SAW resonance frequency, the SAW acts as a capacitor such that the combination of the delay line and the SAW resonator provide a zero at the first undesired frequency creating a notch in the 1088–1113 MHz band.

The delay line 104 can be any reactive element whose reactance changes relatively slowly within the frequency band of interest, i.e. no resonance or anti-resonance point within the frequency band of interest. In the present invention, the delay line 104 is selected from one of the group consisting of an inductor and a transmission line.

The application, reasons and benefits for using inductors for the delay line are the same as for a transmission line and the arguments presented herein are hereby incorporated by reference.

The design of the notch filter of the present invention is governed by the following equation.

$$Z \times (\omega_n^2 - \omega_r^2)/\omega_n C_o (\omega_n^2 - \omega_a^2) \sin(\phi_n) \qquad (4)$$

Where Z is the characteristic impedance of the transmission delay line, $\phi_n$ is the phase delay of the transmission delay line at the notch frequency, $C_o$ is the static capacitance of the SAW resonator, $\omega_4$ and $\omega_a$ are the angular resonant and anti-resonant frequencies of the SAW resonator, respectively, and $\omega_n$ is the angular frequency of the desired notch. In practice, $\omega_n$ is fixed at the notch frequency, and the ratio of $\omega_a/\omega_r$ is determined by the capacitance ratio of the SAW resonator. The parameters $\phi_n$, $C_o$, and $\omega_r$ are then optimized, but the value of Z is constrained according to the above equation.

Figure 4:
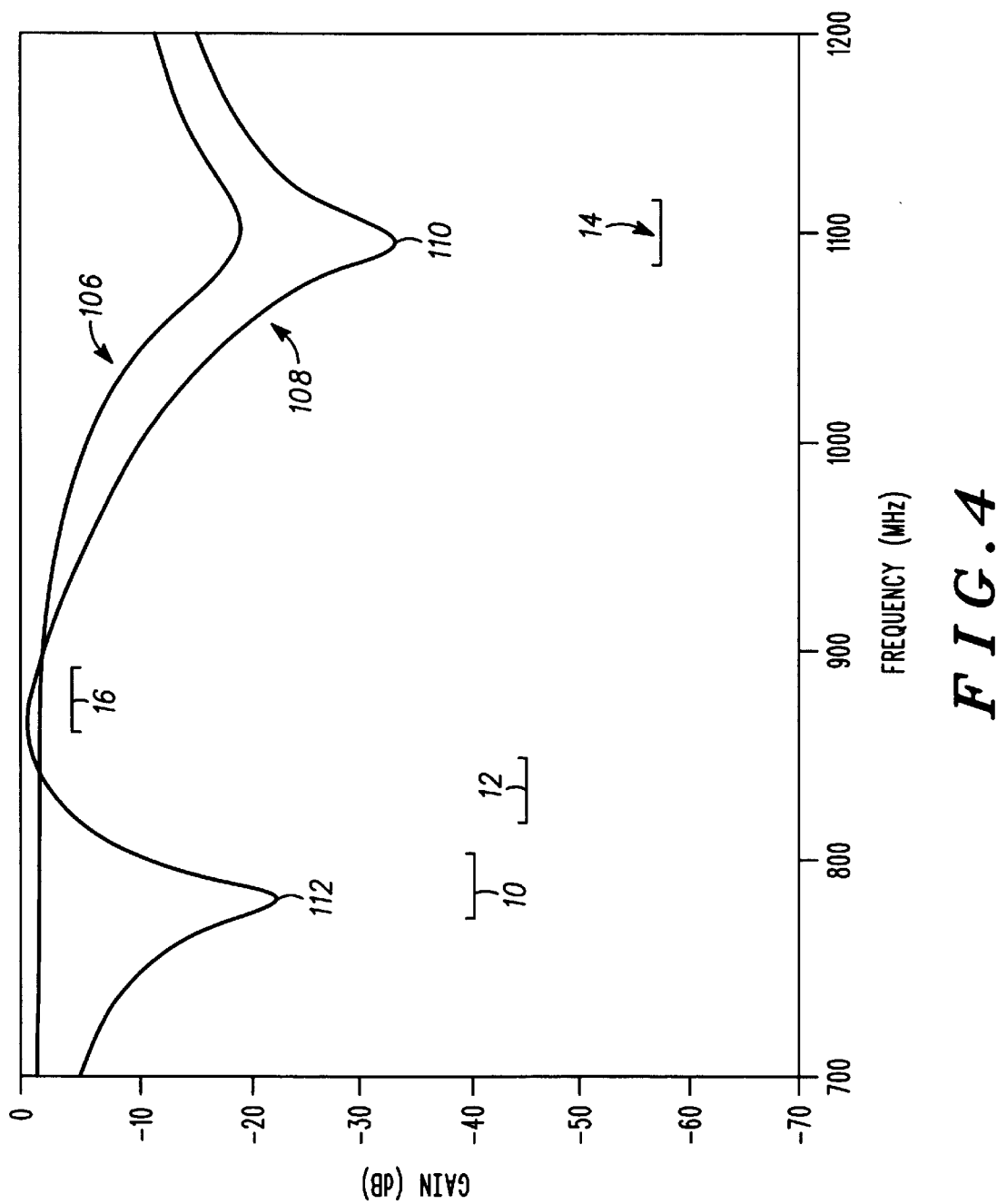
FIG. 4 shows a graph of calculated frequency responses for the two notch filters of FIGS. 2 and 3.

The notch filters of FIGS. 2 and 3 were modeled incorporating the above considerations, and their frequency transmission responses are plotted in FIG. 4. The specifications shown 10,12,14,16 are the same as in FIG. 1. The first curve 106 corresponds to the calculated transmission response of the prior art notch filter 22 of FIG. 2, and the second curve 108 corresponds to the calculated transmission response of the new notch filter 100 of FIG. 3. As can be seen, the notch filter (FIG. 3) of the present invention provides not only improved attenuation 110 at the stopband of rejection specification 14, but also improved insertion loss over the prior art notch filter (FIG. 2) at the insertion loss/bandwidth specification 16. Surprisingly, the notch filter of the present invention also provides a beneficial second attenuation notch 112 at a second band of undesirable frequencies at rejection specification 10, which is very advantageous.

Figures 5, 6:
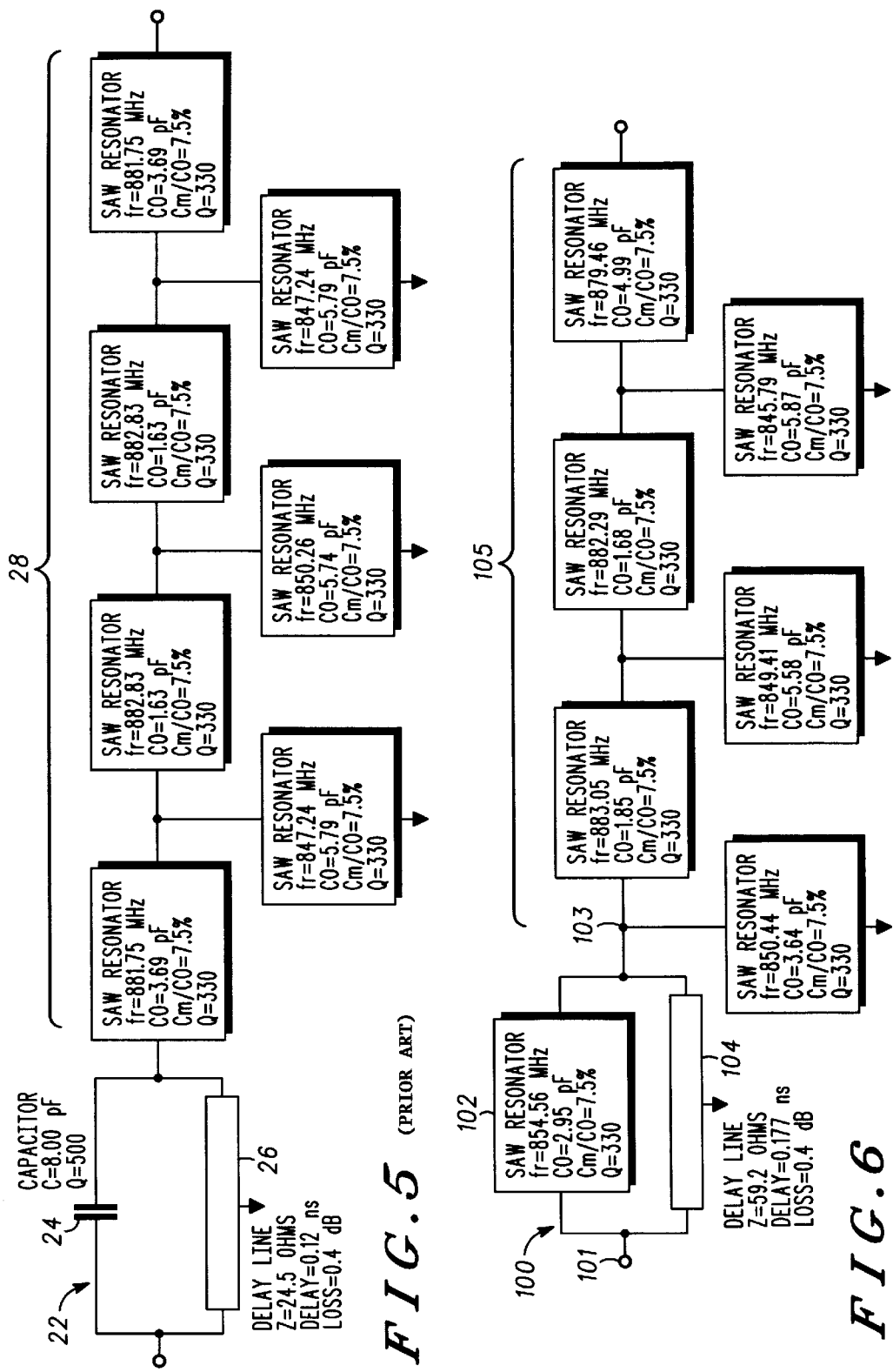
FIG. 5 is a simplified schematic diagram of the prior art notch filter of FIG. 2 cascaded with a prior art SAW ladder filter.
FIG. 6 is a simplified schematic diagram of the notch filter of FIG. 3 cascaded with a SAW ladder filter, in accordance with the present invention.

FIG. 5 shows a complete prior art filter design utilizing a prior art notch filter 22 in cascade with a SAW ladder filter 28. The ladder filter 28 is typically specified to have a passband bandwidth about a center frequency, $f_o$. The design parameters of each of the SAW resonators and the delay line is shown. A seven element ladder filter is shown, although it is possible to provide a ladder filter having as little as one series element and one shunt element. As the number of elements (resonators) increase the total filter insertion loss degrades, but the shape factor improves. Therefore, it is desired to use the minimum number of element necessary to provide the desired shape factor. To meet the specifications given (10,12,14,16 as shown previously) seven SAW elements are needed in the prior art ladder filter 28.

FIG. 6 shows a complete filter design utilizing the notch filter of the present invention in cascade with a SAW ladder filter 105, the SAW ladder filter 105 being coupled to the second port 103 of the notch filter 100. The design parameters are given for each element. In both the cases of FIGS. 5 and 6, the capacitance ratio and Q for the SAW elements are similar to what can be achieved on 42° Y-cut X-propagating lithium tantalate SAW substrate, and the losses in the delay lines and capacitor are typical for multilayer ceramic technology.

The SAW ladder filter provides a passband about a desired frequency and rejection at an undesired frequency. The notch filter augments the rejection performance of the ladder filter at an undesired frequency. The surface acoustic wave resonator of the notch filter also functions as a series resonator of the ladder filter wherein the ladder filter requires one less individual pole due to the additional pole provided by the surface acoustic wave resonator of the notch filter.

Figure 7:
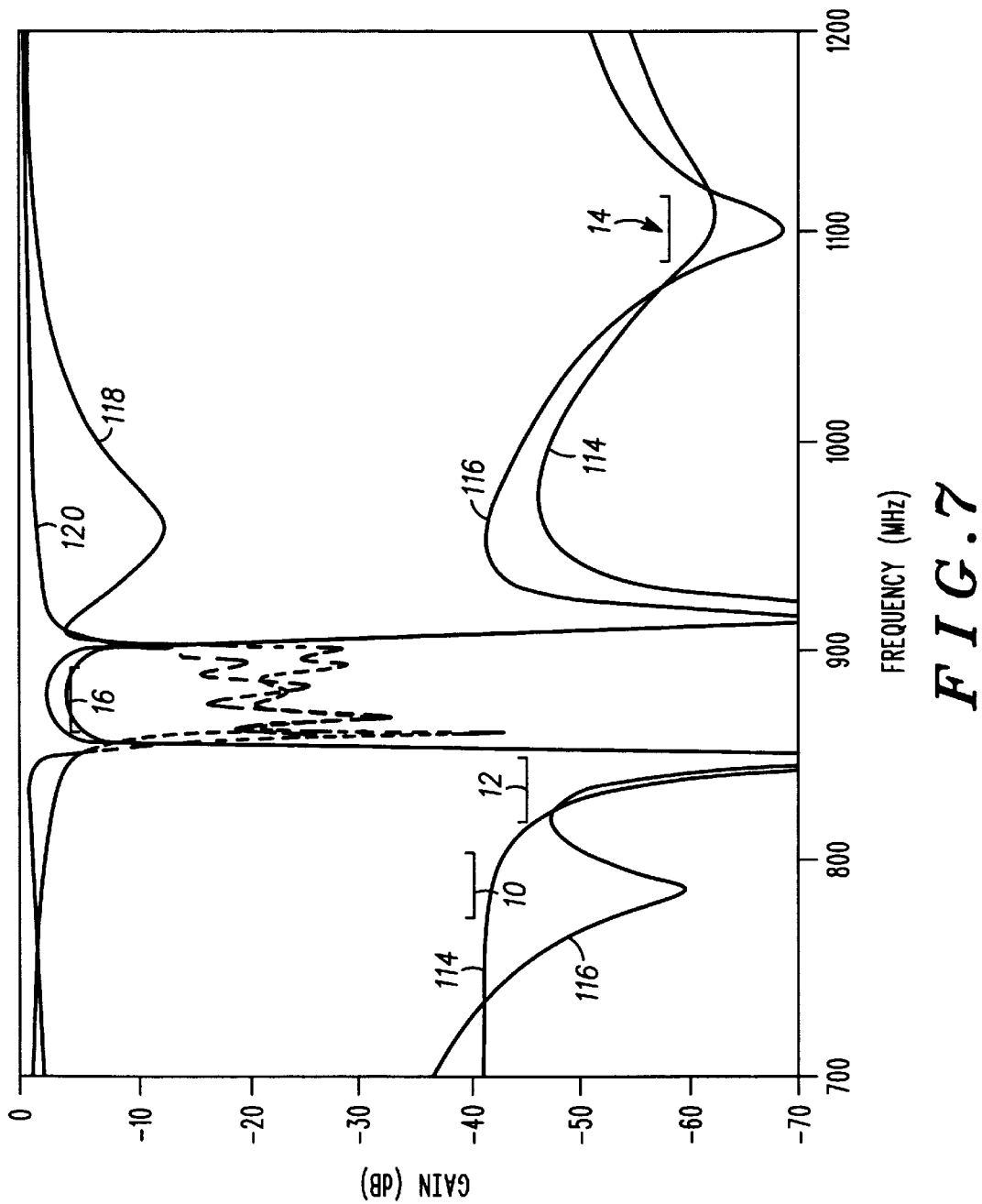
FIG. 7 shows a graph of calculated frequency and return loss responses for the two cascaded filter configurations of FIGS. 5 and 6.

FIG. 7 compares the calculated transmission responses of the two filters of FIGS. 5 and 6. The first response 114 of the cascaded prior art notch filter/SAW ladder filter 22,28 of FIG. 5 is optimized to meet the rejection requirements 14. The second response 116 is of the notch filter 100 of the present invention cascaded with a redesigned ladder filter 105 of FIG. 6 which takes advantage of the extra pole provided by the SAW resonator 102 of the notch filter 100. It should be noted that the cascaded notch/ladder filter 100,105 of FIG. 6 can be realized using the same number of SAW resonators as in the prior art of FIG. 5 (i.e., the SAW resonator 102 of the notch filter 100 also serves to replace one of the resonators of the prior art SAW ladder filter 28 without degrading performance), but without the capacitor 24.

A third response 118 is shown representing the return loss of the cascaded prior art notch filter/SAW ladder filter 22,28 of FIG. 5. A fourth response 120 is shown representing the return loss of the notch filter 100 of the present invention cascaded with the redesigned ladder filter 105 of FIG. 6.

As can be seen in FIG. 7, both responses 114,116 provide similar rejection for the 1088–1113 MHz band, but the response 116 of the new notch filter design clearly has much better insertion loss (1.7 dB lower). Moreover, the return loss 120 of the new notch filter design is clearly much better (4 dB higher) than the response 118 of the prior art filter.

Advantageously, the notch filter of the present invention resolves the problem of meeting all radio specifications by providing an improved tradeoff between insertion loss, rejection, bandwidth, and return loss in a compact filter configuration. In the present invention, a ladder filter is coupled with a notch filter which is operable not only at a stopband but also within the passband.

It should be recognized that the above description is only used as an example and is in no way limiting. In particular, surface acoustic wave devices and especially SAW resonators can be readily scaled in frequency by changing the pitch (periodicity) of the resonator transducer fingers while maintaining the ratios of the resonant frequencies $\omega_r$ obtained from circuit analysis tools or other methods. This allows a designer to re-use a similar design at a slightly different center frequency $f_o$ having similar specifications or permits a quick, two iteration convergence to a desired set of filter characteristics when the relationship between the resonant frequency $\omega_r$ and the transducer acoustic center frequency is not known a priori (e.g., on very high coupling coefficient materials where conventional approximations tend to provide poorer design guidance).

Figure 8:
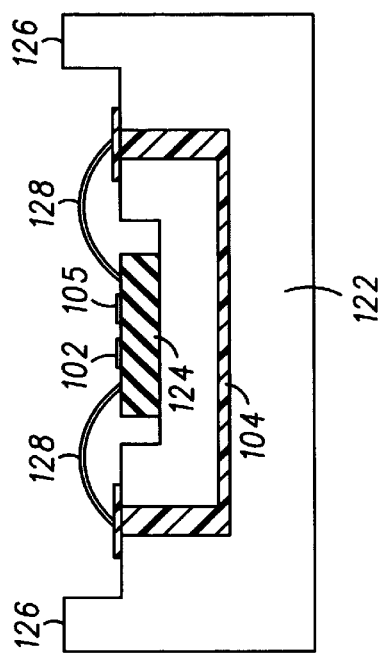
FIG. 8 shows a cross sectional view of a multilayer ceramic package with and embedded delay line, in accordance with the present invention.

In application, the present invention can be realized in a multilayer ceramic integrated circuit packaging configuration for use in a wireless communication device, as shown in FIG. 8 (not to scale). The delay line 104 of the present invention can be embedded within a multilayer ceramic package 122 holding a SAW substrate 124. In practice, the delay line 104 consists of an embedded electrical trace (transmission line) between layers of the multilayer ceramic coupled to two vias which each connect to a surface electrical pad of the multilayer cermaic package. The SAW resonator 102 is connected across these two pads and thusly the delay line 104.

Although, the delay line 104 is shown as being embedded in the substrate directly beneath the SAW substrate 124, this is not necessarily the case as the delay line can be positioned anywhere within, or on the surface of, the multilayer ceramic package 122, and it can be of any shape. The SAW filter, consisting of the notch filter and ladder filter, is disposed onto the substrate using methods that are known in the art. The substrate 124 is bonded into the multilayer ceramic package 122 and electrically connected to the delay line 104 (and package input/output connections (not shown) by wirebonds 128. Alternatively, the substrate 124 can be flipped over and directly attached to the multilayer ceramic package 122 by solder, conductive bumps, or other electrically connective means.

Preferably, the notch filter and ladder filter are commonly disposed on the substrate 124, and the delay line 104 is embedded within the multilayer ceramic package 122 to save space. The multilayer ceramic package 122 is subsequently sealed with a lid (not shown) affixed to an upper surface 126 thereof. The combination of the SAW filter and the embedded multilayer ceramic circuitry provide the best in size and performance required for today's wireless radios.

Figure 9:
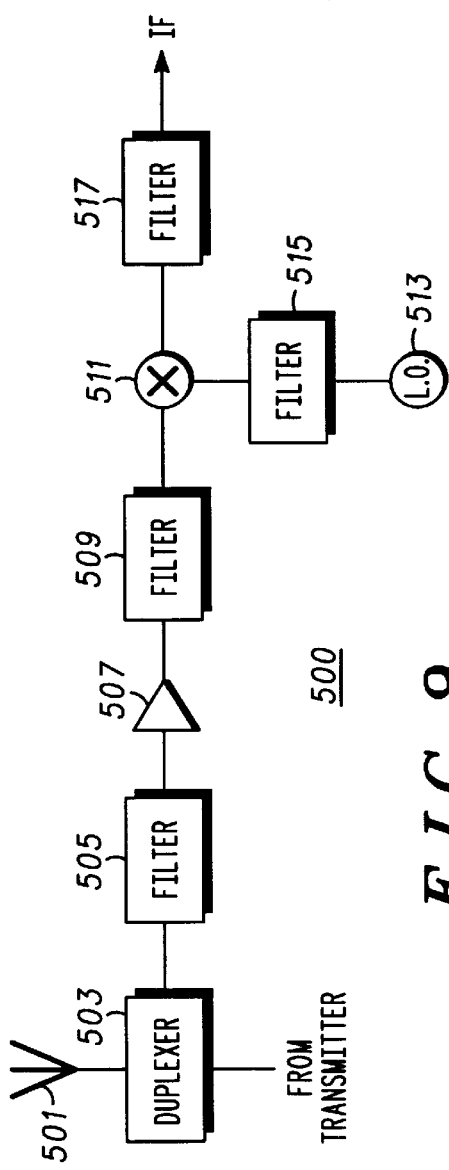
FIG. 9 is a block diagram of a portion of a radio frequency apparatus including the cascaded filters of FIG. 6, in accordance with the present invention.

FIG. 9 is a block diagram of a portion 500 of a radio frequency receiver or other radio communication device including filters, in accordance with the present invention. The portion 500 of the radio apparatus includes an antenna 501, by way of example, used to receive and/or transmit signals. Alternatively, the antenna 501 could be replaced by a fiber-optic link, cable or other signal transmissive media. A duplexer 503 is coupled to the antenna 501 and to a transmitter portion (not shown). The duplexer 503 is a special purpose filter which couples signals to a filter 505. Filter 505 can stand alone or be included within the duplexer 503. The filter 505 and duplexer 503 allow a transmitter and receiver operating in different frequency bands to couple to a common port while remaining isolated from each other. The filter 505 is coupled to an amplifier 507. An output of the amplifier 507 is transmitted to a filter 509 according to the present invention. The filter 509 transmits a signal to a mixer 511. The signal from filter 509 is combined in the mixer 511 with another signal from a local oscillator 513 coupled via a filter 515. An output signal from the mixer 511 is then filtered by a filter 517 to provide an IF output signal.

The arrangement of the present invention may be used to provide any or all of the filters 505, 509, 515, 517. An oscillator and filter analogous to the local oscillator 513 and filter 515 may be employed together with a suitable amplifier and modulator to provide the signal "FROM TRANSMITTER" and this filter (known as a "transmit clean-up filter") as well may be provided in accordance with the present invention. One or more of the filters 505, 509, 515, 517 incorporate the filter of the present invention. Preferably, the duplexer 503 incorporates the ladder filter of the present invention on its receiving side.

Thus, an acoustic filter device has been described which overcomes specific problems and accomplishes certain advantages relative to prior art methods and mechanisms. The improvements over known technology are significant. The problems of prior art filters are avoided. Further, improved insertion loss is realized for compact and lightweight filters together with improved design flexibility.

The foregoing description of the specific embodiments will so fully reveal the general nature of the invention that others can, by applying current knowledge, readily modify and/or adapt for various applications such specific embodiments without departing from the generic concept, and therefore such adaptations and modifications should and are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the broad scope of the appended claims.

What is claimed is:

1. A notch filter with a first port and a second port and having a first attenuation at a first undesired frequency, the notch filter comprising:
   a delay line coupled in series between the first and second ports; and
   a surface acoustic wave resonator coupled in series between the first and second ports and in parallel with the delay line,
   the surface acoustic wave resonator and the delay line being configured to provide a zero at the first undesired frequency and a pole at a desired frequency such that insertion loss contributed by the notch filter at the desired frequency is minimized.

2. The notch filter of claim 1, wherein the surface acoustic wave resonator is configured to act as a capacitor when operated above a resonant frequency of the surface acoustic wave resonator such that the combination of the delay line and the resonator provide the zero at the first undesired frequency.

3. The notch filter of claim 1, wherein the notch filter provides a second attenuation at a second undesired frequency.

4. The notch filter of claim 1, further comprising a surface acoustic wave ladder filter coupled to the second port, the surface acoustic wave ladder filter providing a passband about the desired frequency and rejection at the undesired frequency, the notch filter augmenting rejection performance of the ladder filter at the undesired frequency, the surface acoustic wave resonator of the notch filter functioning as a series resonator of the ladder filter wherein the ladder filter requires one less individual pole due to the additional pole provided by the surface acoustic wave resonator of the notch filter.

5. The notch filter of claim 4, further comprising a multilayer ceramic package and a piezoelectric substrate, wherein the surface acoustic wave resonator and the surface acoustic wave ladder filter are commonly disposed on the piezoelectric substrate which is subsequently disposed within the multilayer ceramic package, and wherein the delay line is embedded in the multilayer ceramic package and is electrically connected to the piezoelectric substrate.

6. The notch filter of claim 1, wherein the delay line is selected from one of the group consisting of a transmission line and an inductor.

7. A surface acoustic wave filter including a ladder filter disposed on a piezoelectric substrate in a multilayer ceramic package, the surface acoustic wave filter including a notch filter comprising:
   a delay line coupled in series between first and second ports; and
   a surface acoustic wave resonator coupled in series between the first and second ports and in parallel with the delay line,
   the surface acoustic wave resonator and the delay line being configured to provide a zero at the first undesired frequency and a pole at a desired frequency such that insertion loss contributed by the notch filter at the desired frequency is minimized,
   the surface acoustic wave ladder filter coupled to the second port, the surface acoustic wave resonator of the notch filter functioning as a series resonator of the ladder filter wherein the ladder filter requires one less individual pole due to the additional pole provided by the surface acoustic wave resonator of the notch filter.

8. The surface acoustic wave filter of claim 7, wherein the surface acoustic wave resonator is configured to act as a capacitor when operated above a resonant frequency of the surface acoustic wave resonator such that the combination of the delay line and the resonator provide the zero at the first undesired frequency.

9. The surface acoustic wave filter of claim 7, wherein the notch filter provides a second attenuation at a second undesired frequency.

10. The surface acoustic wave filter of claim 7, wherein the piezoelectric substrate is selected from one of the group consisting of ST-cut quartz, lithium niobate, lithium tetraborate, and lithium tantalate.

11. The surface acoustic wave filter of claim 7, wherein the delay line is selected from one of the group consisting of a transmission line and an inductor.

12. A radio communication device having a radio frequency receiver, transmitter, and a duplexer including a notch filter, the notch filter with a first port and a second port and having a first stopband at a first undesired frequency, the notch filter comprising:

a delay line coupled in series between the first and second ports; and a surface acoustic wave resonator coupled in series between the first and second ports and in parallel with the delay line, the surface acoustic wave resonator and the delay line being configured to provide a zero at the first undesired frequency and a pole at a desired frequency such that insertion loss contributed by the notch filter at the desired frequency is minimized.

* * * * *